United States Patent [19]

Davis

[11] Patent Number: 5,568,058
[45] Date of Patent: Oct. 22, 1996

[54] AUTOMATIC MOTOR TESTER

[75] Inventor: Wendell Davis, Montgomery County, Kans.

[73] Assignee: Emerson Electric Co., St. Louis, Mo.

[21] Appl. No.: 246,680

[22] Filed: May 20, 1994

[51] Int. Cl.$^6$ ............................................. G01R 31/34
[52] U.S. Cl. ................................................. 324/772
[58] Field of Search ...................... 414/935; 198/394, 198/406; 209/571–573; 318/490; 340/648; 324/772

[56] References Cited

U.S. PATENT DOCUMENTS

| | | | |
|---|---|---|---|
| 3,231,817 | 1/1966 | Bailey | 324/772 |
| 3,282,420 | 11/1966 | Frechette | 209/573 |
| 3,758,857 | 9/1973 | Simpson | 324/772 |
| 3,881,605 | 5/1975 | Grossman | 198/394 |
| 3,992,765 | 11/1976 | Silverbush | 198/394 |
| 4,103,232 | 7/1978 | Sugita | 198/394 |
| 4,418,644 | 12/1983 | Young | 198/394 |
| 4,593,820 | 6/1986 | Antonie | 324/772 |
| 4,658,213 | 4/1987 | Finley . | |
| 4,777,446 | 10/1988 | Santandrea et al. . | |
| 4,801,877 | 1/1989 | Herrick et al. . | |
| 4,908,126 | 3/1990 | Willberg | 209/573 |
| 4,922,172 | 5/1990 | Roddy et al. . | |
| 4,938,654 | 7/1990 | Schram | 198/394 |
| 4,996,477 | 2/1991 | Keeler et al. . | |
| 5,151,650 | 9/1992 | Frisbie | 209/573 |
| 5,231,348 | 7/1993 | Herrick et al. . | |
| 5,291,128 | 3/1994 | Shekar et al. . | |
| 5,311,119 | 5/1994 | Bullock | 324/754 |
| 5,420,523 | 5/1995 | Walker et al. | 324/772 |

FOREIGN PATENT DOCUMENTS 0907477  2/1982  U.S.S.R. ............................. 324/772

*Primary Examiner*—Ernest F. Karlsen
*Assistant Examiner*—Russell M. Kobert
*Attorney, Agent, or Firm*—Polster, Lieder, Woodruff & Lucchesi

[57] ABSTRACT

An automatic motor tester runs performance and quality control checks on newly assembled motors. The motor tester includes a vertical support, contacts contained within a housing which is mounted to the vertical support so as to be movable horizontally and vertically relative to the vertical support, and a controller operatively connected to the contacts to send signals to and receive signals from the motor for motor testing. The motor is positioned above a lifter which is operable to lift the motor so as to automatically electrically connect the motor contacts to the test contacts so that the test operator does not handle electrical leads.

23 Claims, 3 Drawing Sheets

AUTOMATIC MOTOR TESTER

BACKGROUND OF THE INVENTION

This invention relates to equipment for the testing of dynamoelectric machines, and in particular, to an automatic motor tester.

It has long been the practice in the manufacture dynamoelectric machines and in particular, of electric motors, to run a series of operational and quality control checks to ensure that products produced by a motor plant, for example, are operating properly prior to shipment to a particular customer. The testing equipment generally includes leads which are connected to contacts of leads on the motor to connect the motor to an analyser or controller, such as a computer, which will run the required tests. In the past, the motor connection to the motor test device was accomplished manually. Such manual connection requires the operator to connect live wires to the motor or to disconnect electrical power to the test device, so that the wires will not be live. Electric motors can and often are relatively bulky and heavy, making manual handling of the motor and connection of the test wires to the motor difficult. Because the manual connection process is time consuming, testing often was restricted to selected samples of a production run. Selected sample testing, however, is not acceptable in many situations. For example, some customers require one-hundred percent test of a product. Even where the customer does not require full order testing, some motor types demand complete testing. Brushless permanent magnet motors and associated electronic control systems are finding greater acceptance in certain applications. Because of the number of components that may cause failure of the product, one-hundred percent testing of such motors and associated controls is required. Prior known manufacturing and testing processes do not lend themselves to efficient production when one-hundred percent testing is required.

SUMMARY OF THE INVENTION

One object of the present invention is the provision of an automatic electric motor tester.

Another object is the provision of such a tester which substantially eliminates the need for the operator to connect the test wires to the motor.

Another object is the provision of such a tester which will automatically connect the test contacts to the motor contacts to electrically connect the motor to the tester.

Another object is the provision of such a motor tester which can perform one-hundred percent testing of a motor production run.

These and other objects will become apparent to those skilled in the art in light of the following drawings and accompanying figures.

According to the invention, generally stated, a motor tester is provided to perform quality control checks on electric motors. The tester includes a vertical support, at least one test contact mounted in a contact housing, and a controller operatively connected to the contact. The housing is connected to the vertical support to move vertically and horizontally relative to the support. The test contacts are removably connectable to contacts on the motor. In a production line, the motor is generally assembled on a pallet. The test station includes a lift which raises the pallet, and hence the motor, to automatically electrically connect the motor contacts to the test contacts.

The test contacts are mounted to a plate, which in turn is mounted in the housing. The contacts may move vertically relative to the plate. The plate includes openings through which the contacts extend. Each test contact has a contact body which extends through the opening, a cap larger than the opening at an end of the body beneath the plate and the housing, and a pin extending through the body above the plate. A spring is journaled about the contact body between the contact head and the plate to bias the contact downwardly. The contact caps are preferably silver coated to prevent tack welding of the test contacts to the motor contacts by the current which is passed through the contacts.

A gear box is mounted to the vertical support and has a threaded rod rotatably journaled therein. The gear box includes a gear which meshes with the rod. The gear is rotated by, for example, a crank, to rotate the threaded rod. The threaded rod is threaded thorough a slide to which the housing is mounted. Thus, rotation of the rod, by the crank, will move the housing vertically relative to the vertical support. Guide rods are provided to maintain the housing in a generally horizontal position, and to prevent rotation of the housing as the rod is rotated.

The housing is supported on the slide by generally horizontal support bars. The support bars are slidably received in horizontal blocks at opposite sides of the slide. The horizontal position of the housing may be adjusted by sliding the bars in the horizontal blocks.

The tester is operated by a pair of switches which must be depressed to activate the lifter to raise the motor into contact with the test contacts and to initiate the test. To reduce the possibility of the operator touching the contacts during a test procedure, two normally open switches must be held closed by the operator to conduct the test. The switches cannot be release before the end of the test if the test is to be completed. The switches must be held closed to maintain the flow of current through the contacts. When the test is complete, the operator can release the switches and activate another switch to lower the lift.

DESCRIPTION OF THE PREFERRED EMBODIMENT

Figure 1:
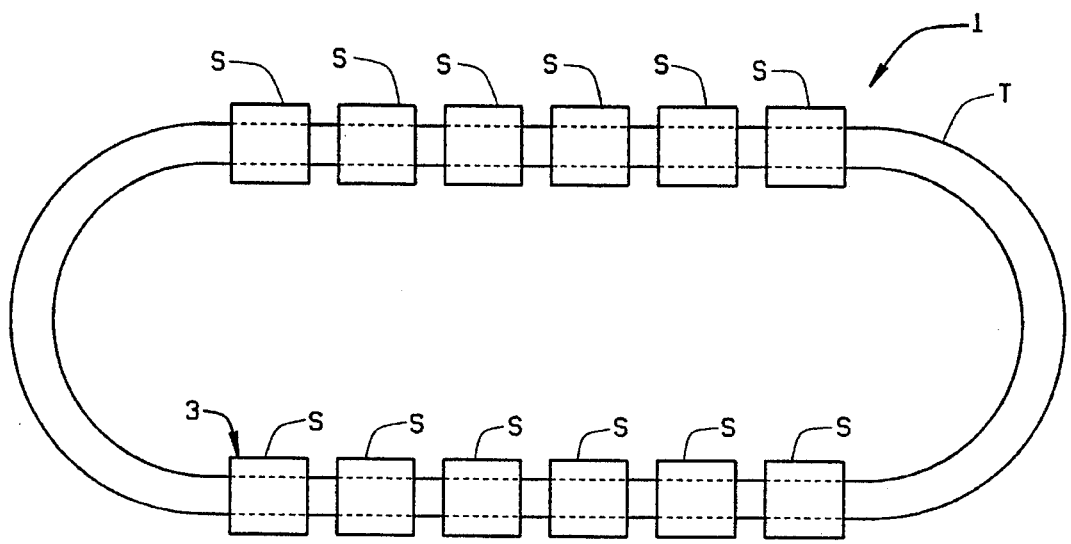
FIG. 1 is a schematic of a motor production assembly line.
Figure 3:
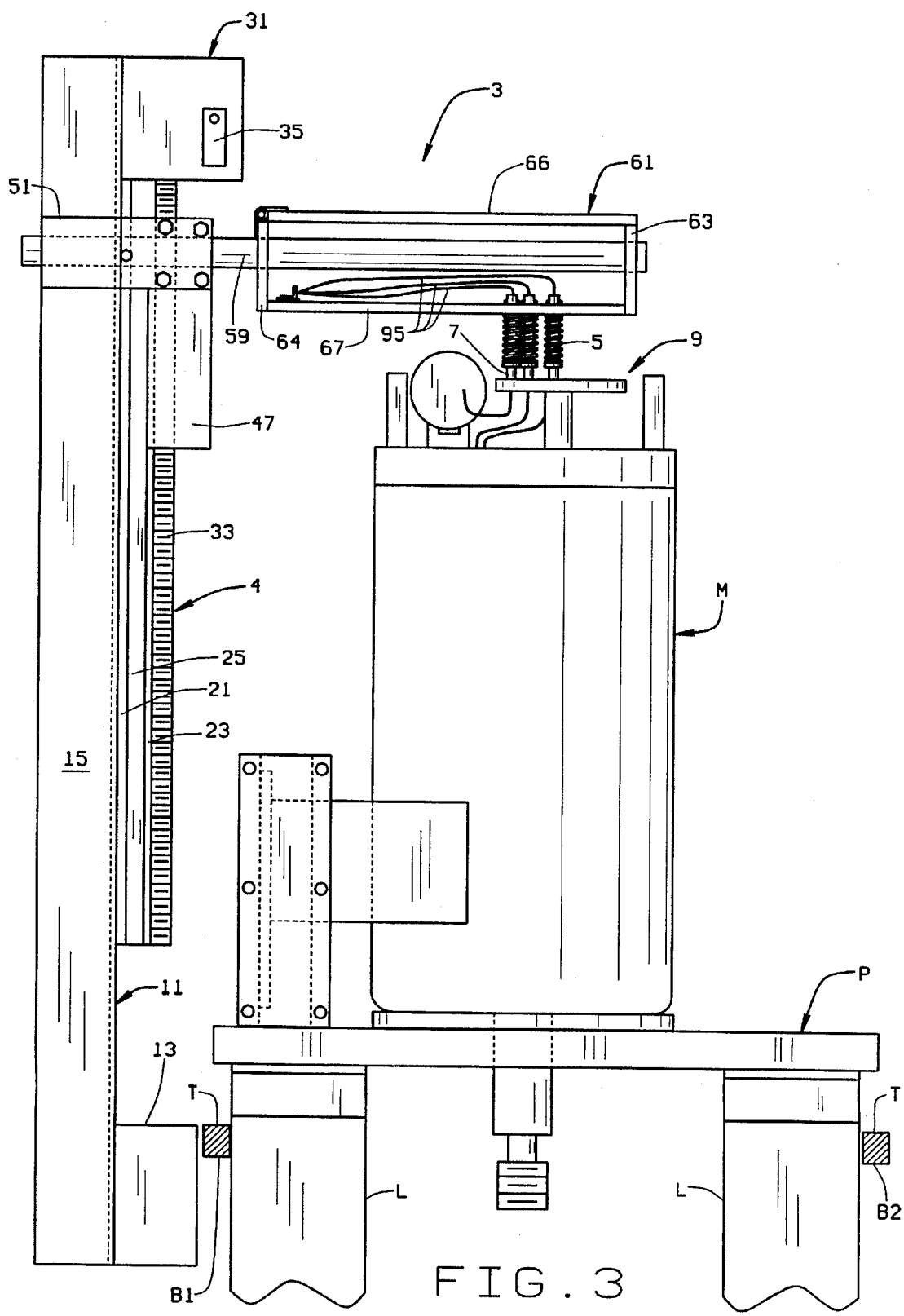
FIG. 3 is a side elevational view of the motor tester of FIG. 2 illustrating a motor in operative position for testing.

A motor production assembly line 1 is shown schematically in FIG. 1. Assembly line 1 includes a moving track T having a plurality of stations S situated thereabout. Although the track T is shown to be oval, a linear track could be used. Track T preferably includes two spaced apart belts B1 and B2 (FIG. 3). At the various stations S, motor components are assembled to produce a motor M. As is conventional, the motor components are assembled on a pallet P which extends across and rides on the belts B1 and B2. Each station has lifters L positioned between the belts which raise the pallet above the moving track to stop the travel of the particular pallet to allow specific components to be added at that point. When the components of that station have been added, the lifters L are lowered to set the pallet back down on the track. The pallet, with the partially assembled motor, then is carried by the track T to the next station S. As is also conventional, a testing station 3 is provided along track T where the assembled motor is run through a series of operational and quality control checks or tests.

Testing station 3 has a test apparatus 4 which, as will be described, is automatically connected to the motor. Test apparatus 4 includes test contacts 5 which are removably connectable to contacts 7 of a motor's control circuitry 9. The test contacts 5 are operably connected to a test controller 11 (i.e. a CPU) which supplies a current to the motor and receives and interprets signals from the motor to test and analyze the motor's performance. The controller includes a test circuit which evaluates the output from the motor. Such a test circuit may be made in accordance with the test circuit described in U.S. Pat. No. 4,922,172, assigned to the assignee of the present invention, which is incorporated herein by reference. A switch, such as a push button 12, is provided which has to be depressed by the operator to conduct the motor tests.

Figure 2:
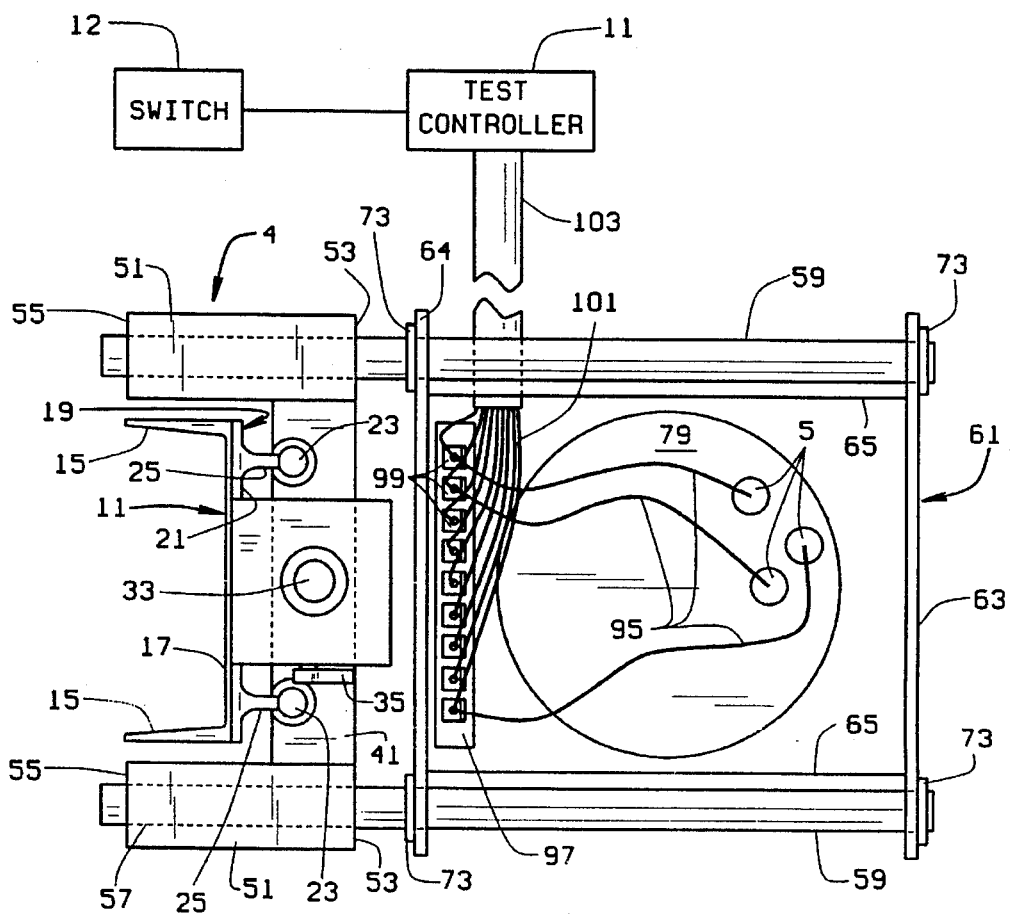
FIG. 2 is a top plan view of one illustrative embodiment of a motor tester assembly of the present invention.

The test apparatus is shown in FIGS. 2 and 3. Test apparatus 4 includes a vertical support arm 11 which extends above and across track T. Arm 11 is preferably positioned along an outer edge of one of the belts B1 or B2, rather than between the belts. Arm 11 is secured to a spacer 13 which serves to space the arm from the track. Arm 11 includes a pair of spaced apart, rearwardly extending legs 15 connected by a face plate 17. An elongate, vertical guide 19 is mounted to face plate 17 and includes a base 21 with a pair of guide rods 23 spaced forwardly of base 21 by arms 25. Guide 19 and guide rods 23 preferably extend the length of vertical arm 11.

Figure 4:
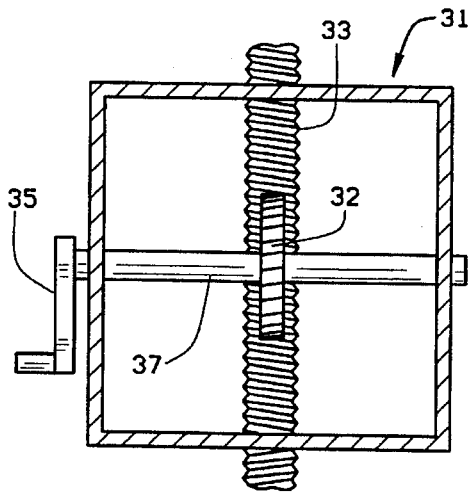
FIG. 4 is a cross-sectional, diagrammatic view of a gear box employed with the motor tester of FIG. 2.

A gear box 31 (FIG. 4) is mounted to arm 11 at the top thereof to extend forwardly of face plate 17. Gear box 31 houses a helical gear 32 which meshes with an elongate threaded rod 33 journaled in box 31. A crank 35, external of gear box 31, is operatively connected to gear 32, so that rotation of crank 35 will rotate rod 33. Preferably, the crank is connected to, and rotates, a shaft 37. Gear 32 is mounted on shaft 37 to mesh with the threads of bar 33. Gear 32 preferably has a low gear ratio so that vibrations created during a motor test, which may cause the gear to rotate slightly, will not rotate the bar 33. Other gearing mechanisms could also be used to rotate the threaded bar 33. For example, the shaft 33 could be operatively connected to a motor, to be driven by the motor. The motor could directly drive the shaft 33, or a belt or gear drive could be used to drive the shaft. Crank 35 could similarly drive a belt or gear drive which, in turn, would rotate the shaft 33.

Figure 5:
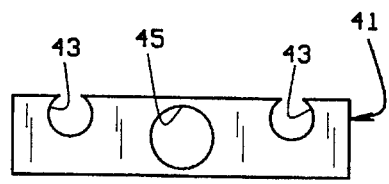
FIG. 5 is a top plan view of a slide employed with the motor tester of FIG. 2.

A slide 41, shown in detail in FIG. 5, is slidably mounted to guide 19. Slide 41 includes a channels 43 sized and shaped to be journaled about guide rods 23. Rods 23 cooperate with channels 43 to maintain slide 41 is a generally horizontal, level position. A threaded bore 45 extends through slide 41 to receive threaded bar 33. As can be appreciated, when bar 33 is rotated in one direction, the slide will be lowered relative to the arm 11, and when bar 33 is rotated in the opposite direction, it will be raised. Guide rods 23 also function to prevent the slide from rotating with the rod 33 so that the slide will in fact move vertically as the rod is rotated.

Slide 41 also includes a downwardly extending stop block 47. Stop block 47 is provided to prevent slide 41 from being lowered too far. Block 47 is of a sufficient length to contact spacer 13 before slide 41 is lowered beyond the end of guide rods 23. Gear box 31 serves as an upper stop to prevent the slide from being raised too far. The stop block 47, in combination with the spacer 13, and the gear box 31 thus act as lower and upper limits, respectively, to the travel path of the slide 41.

Elongate horizontal blocks 51 are secured to opposite sides of slide 41. Blocks 51 have front surfaces 53 which are preferably flush with the front of slide 41 and back surfaces 55 which are spaced behind spacer 41, to be about even with the back of legs 15 of the vertical support arm 11. Blocks 51 have axial bores 57 extending between the front 53 and back 55 surfaces which receive support bars 59. Bars 59 are frictionally received and held in blocks 51. The friction fit holds the bars in place, but allows for horizontal adjustment of the bars, should adjustment be needed.

Figures 6, 7:
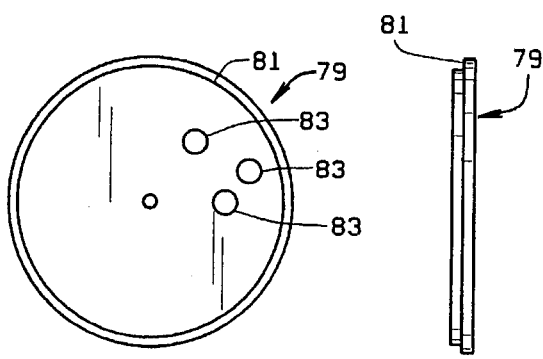
FIG. 6 is a bottom plan view of a contact plate employed with the motor tester of FIG. 2.
FIG. 7 is a side elevational view of the contact plate.
Figure 8:
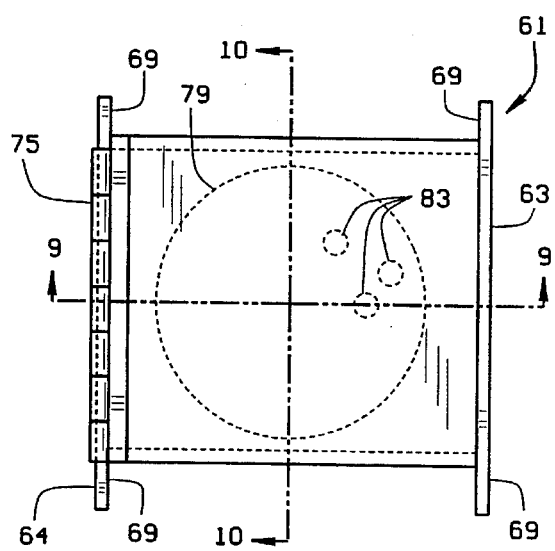
FIG. 8 is a top plan view of a contact plate housing.
Figure 9:
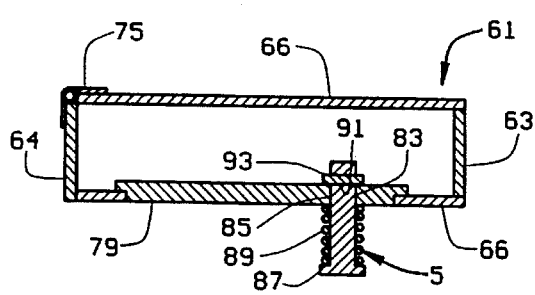
FIG. 9 is a cross-sectional view of the contact plate housing taken along line 9—9 of FIG. 8.
Figure 10:
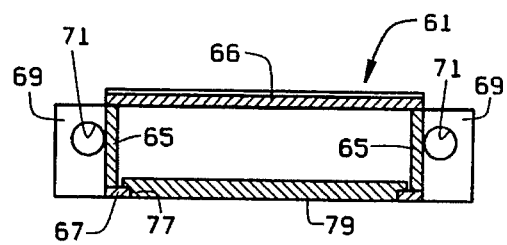
FIG. 10 is a cross-sectional view of the contact plate housing taken along line 10—10 of FIG. 8.

A contact housing 61 is mounted on support bars 59. Housing 61 is preferably made of a clear plastic, but can be made of any desired material. Housing 61, shown in FIGS. 8–10, includes a front wall 63, a back wall 64, side walls 65, a top 66, and a bottom 67. Front wall 63 and back wall 64 each have flanges 69 which extend beyond side walls 65. Flanges 69 have openings 71 through which support bars 59 extend to mount housing 61 on bars 59. Snap rings 73 are provided on bars 59 to prevent housing 61 from sliding on bars 59. A hinge 75 pivotally connects top 66 to back wall 64. Bottom wall 67 has a circular opening 77 formed therein which receives a contact plate 79, made of an electrically non-conductive material. Contact plate 79 (FIGS. 6 and 7) is circular in plan and includes an upper circumferential flange 81 which rests on the inner surface of housing bottom wall 67, as seen in FIGS. 9 and 10. Plate 79 also includes openings 83 through which contacts 5 extend.

Contacts 5, as best seen in FIG. 9, each include a bar or body 85 which slidably extends through plate opening 83. Bar 85 includes a cap 87 at a bottom thereof, beneath or outside of housing 61. A spring 89 is journaled about bar 85 between cap 87 and the bottom of plate 79 to bias the contact downwardly. Spring 89 functions to provide a good electrical connection between the test and motor contacts. To prevent the contacts from falling out of plate 79, body 85 includes an opening 91 near its top which receives a pin 93, such as a cotter pin.

Three contacts 5 are shown in the drawings. However, the test assembly could include fewer or more contacts, as is needed to conduct the appropriate tests. Wires 95 (FIG. 2) are connected to the contacts within housing 61 and extend to a terminal block 97. The terminal block 97 has a plurality of connectors 99, to which wires 101 are connected. Wires 101 are collected as a bundle 103 and are connected to controller 11. Controller 11 is thus operatively connected to the contacts 5.

Generally, a large current is passed through the contacts 5 to test the motor. The contact cap 87 has an outer surface which will resist being tac welded to the motor by the current. To accomplish this, the cap 87 is coated with silver. Other coatings which resist tack welding could also be used.

In operation, a motor M is introduced into the testing station 3. Stops at the station prevent the continued movement of the pallet with the motor. The operator depresses the push button 12 to activate lift L to connect the motor contacts to test contacts 5 and to activate the test assembly 4. Preferably, the operator must depress push button 12 throughout the duration of the test. Preferably, there are two push buttons 12, one for each hand of the operator, which must remain depressed. This will ensure that the operator will not attempt to touch the motor, or any of the contacts, during the test to reduce the possibility that the operator can touch the contacts while current is running through wires 95. The operator must keep the buttons depressed during the test. When the test is complete, he may release the push buttons 12. After the motor is tested, it stays elevated to allow the operator to retest the motor if he so desires. As long as the motor is elevated, it remains electrically connected to the test assembly. However, current runs through the contacts 5 only when tests are being run. When the operator is ready to release the motor, he activates another switch which lowers the lifts L. The pallet is then set back on the track and the track carries the motor to the next station where the end shield cover is applied if the motor passed the tests, or the motor is discarded if it failed the tests.

Prior to depressing the buttons 12, the height of the housing 61 is adjusted, if necessary, so that when the motor is raised, it will be placed in electrical contact with test contacts 5. Preferably, it is positioned such that the contacts 5 will be raised slightly when the motor is raised. The downward force of spring 89 will then ensure a good electrical connection between the test and motor contacts. If necessary, the horizontal position of the head can also be adjusted by sliding mounting bars 59 in blocks 51. Generally, when a batch of motors are tested, the motors are all of the same size. Thus, the position of housing 61 need only be adjusted for the first motor of the batch. For the second, third, fourth, etc. motor of the batch, the housing will be properly positioned, and the operator need only depress buttons 12 to conduct the motor tests.

As can be seen, the automatic motor tester automatically connects the contacts 5 to the motor contacts to test the motor. This eliminates the need for the operators to make any of the connections. This both speeds up the testing procedure and reduces the possibility that the operator will be shocked by the testing assembly. Because the motor tester speeds up connection of the motor to the testing device, and because handling of the motor by the operator is substantially eliminated, the tester can be used to test all the motors of a production run.

Numerous variations within the scope of the appended claims will be apparent to those skilled in the art in light of the preceding description and accompanying drawings. For example, fewer or more than two guide rods 23 could be used. Rather than having guide rods which extend from arm 11, arm 11 or guide 19 could be provided with slots which would receive fingers extending rearwardly from slide 41. Contact plate 79 is provided primarily to facilitate the mounting of test contacts 5 in the housing. As long as the housing bottom is made of electrically non-conductive material, or the contact bodies are insulated, the contacts could be mounted directly in the bottom of housing 61 and the plate 79 could be eliminated. These examples are merely illustrative.

I claim:

1. An automatic tester for testing electric motors, the motors each including a control circuit having contacts; the tester including:

a support;

at least one test contact operably mounted to said support to be spaced from said motor, said at least one test contact being removably connectable to said motor control circuit contacts;

a contact housing mounted to said support, said at least one test contact being mounted in said contact housing, said contact housing being stationary during a motor test procedure;

a controller in electrical communication with said at least one test contact, said controller sending a signal to and receiving a signal from said motor to test said motor; and a lifter, said motor being positioned with respect to said lifter such that operation of said lifter moves said motor to bring said motor control circuit contacts into contact with said at least one test contact;

said contact housing being movable relative to said support to adjust the position of said test contact such that said motor circuit test contact will be brought into contact with said test contact when said motor is moved by said lifter.

2. An automatic tester for testing an electric motor, the motor including a control circuit having contacts; the tester including:

a vertical support;

at least one test contact operably mounted to said vertical support to be positioned above said motor, said at least one test contact being removably connectable to said motor control circuit contacts, said at least one test contact being mounted on a contact plate for vertical movement relative to the contact plate;

a contact housing mounted to said vertical support, said at least one test contact and said contact plate being mounted in said contact housing, said contact housing being stationary during a motor test procedure;

a controller in electrical communication with said at least one test contact, said controller sending signals to and receiving signals from said motor to test said motor; and a lifter, said motor being positioned above said lifter, said lifter being operable to lift said motor to bring said motor control circuit contacts into contact with said at least one test contact;

said contact housing being movable relative to said vertical support to adjust the position of said test contact such that said motor circuit test contact will be brought into contact with said test contact when said motor is raised by said lifter.

3. The automatic tester of claim 2 wherein the contact plate includes an opening for said at least one test contact, said at least one test contact including a contact body which extends through said opening, a cap larger than the opening at an end of said body beneath said contact plate, and a pin extending through said body above said contact plate.

4. The automatic tester of claim 3 wherein a spring is journaled about said contact body to bias said test contact downwardly; said spring being positioned between said contact body cap and a bottom of said contact plate.

5. The automatic tester of claim 2 wherein said contact housing is movable vertically and horizontally with respect to the vertical support.

6. The automatic tester of claim 5 including a gear box operable to rotate a threaded rod, said contact plate being operably connected to said threaded rod such that rotation of said rod in one direction raises said contact housing and rotation of said rod in a second direction lowers said contact housing.

7. The automatic tester of claim 6 including a crank shaft and a gear mounted in said gear box in meshing contact with said threaded rod, said crank shaft being operatively connected to said gear to rotate said gear and hence said rod.

8. The automatic tester of claim 7 including a slide to which said contact housing is mounted, said slide having a threaded bore which receives said threaded rod.

9. The automatic tester of claim 8 including at least one guide rod spaced from said vertical support, said slide having at least one channel which receives said at least one guide rod.

10. The automatic tester of claim 8 including horizontal positioning means for moving said contact plate horizontally relative to said vertical support.

11. The automatic tester of claim 10 wherein said horizontal positioning means includes mounting blocks secured to opposite sides of said slide, said mounting blocks having generally horizontal bores which slidably receive horizontal support bars, said support bars extending through a portion of said housing.

12. The automatic tester of claim 11 wherein said contact housing has a pair of opposing walls defining flanges, said flanges having holes therein through which said support bars extend.

13. The automatic tester of claim 2 wherein said test contact is coated with a conductive material which will resist tack welding during testing.

14. The automatic tester of claim 13 wherein said conductive material is silver.

15. A motor tester for automatically testing electric motors, said electric motors including a control circuit having contacts thereon; said tester including:

a support;

a housing mounted to said support, said housing being stationary during a motor testing procedure;

test contacts in said housing, said test contacts extending through a wall of said housing, said test contacts being automatically connectable to said motor circuit contacts; and a controller operatively connected to said test contacts to control the testing of said motor;

said housing being movable relative to said support to adjust the position of said housing, and hence said test contacts, to adjust the position of said test contacts, such that said tester may be used to test motors of different sizes.

16. The motor tester of claim 15 wherein said support is positioned vertically, the motor tester further including a gear box mounted to said support and a threaded rod rotatably journaled in said gear box and extending downwardly from said gear box; said gear box being operable to rotate said threaded rod; said housing being operatively mounted to said threaded rod such that rotation of said rod in one direction will raise said housing and rotation of said rod in a second direction will lower said housing.

17. The motor tester of claim 15 including a slide to which said housing is mounted; said housing being movable horizontally along said slide.

18. The automatic tester of claim 15 wherein said housing includes a front wall, a back wall, and side walls extending up from said housing bottom, and a top hingedly connected to one of said front wall, back wall, and side walls.

19. The automatic tester of claim 18 including a slide mounted on said support, said slide being movable vertically relative to said support; said housing being mounted to said slide to be movable horizontally relative to said slide; said slide including generally horizontally extending support bars, said housing being slidably mounted on said support bars.

20. In an electric motor assembly line including a track, a plurality of assembly stations positioned around said track at which components of an electric motor are assembled to produce an electric motor and a testing station where the assembled motor is tested, and a mechanism at said testing station to move said assembled motor relative to said track, the improvement comprising a motor tester including testing contacts and a controller operatively connected to said testing contacts; said testing contacts being substantially stationary during a motor testing procedure; said testing contacts being mounted in said testing station to be movable so that the position of said testing contacts can be adjusted; said automatic motor tester being operable to activate said mechanism to move said assembled motor automatically to connect said motor to said testing contacts so as to test said motor automatically.

21. The improvement of claim 20 including at least one switch operably connected to said controller, said switch being operable to activate said lift mechanism to raise said motor into contact with said test contacts and to initiate testing of said motor.

22. The improvement of claim 21 wherein said switch is biased open, whereby an operator must maintain said switch in a closed position during a test procedure for said controller to perform said test procedure.

23. In an electric motor assembly line including a track, a plurality of assembly stations positioned around said track at which components of an electric motor are assembled to produce an electric motor and a testing station where the assembled motor is tested, and a motor positioning mechanism at said testing station to position said motor at said testing station, the improvement comprising a motor tester including testing contacts and a controller operatively connected to said testing contacts; said testing contacts being substantially stationary with respect to said motor during a motor testing procedure; said testing contacts being mounted in said testing station to be movable so that the position of said testing contacts can be adjusted; said automatic motor tester being operable to activate said motor positioning mechanism to position said assembled motor to automatically connect said motor to said testing contacts to test said motor automatically.

* * * * *